United States Patent
Lin et al.

(10) Patent No.: US 8,341,489 B2
(45) Date of Patent: Dec. 25, 2012

(54) PERMUTED ACCELERATED LDPC (LOW DENSITY PARITY CHECK) DECODER

(75) Inventors: Alvin Lai Lin, Londonderry (GB); Andrew J. Blanksby, Neptune, NJ (US)

(73) Assignee: Broadcom Corporation, Irvine, CA (US)

( * ) Notice: Subject to any disclaimer, the term of this patent is extended or adjusted under 35 U.S.C. 154(b) by 749 days.

(21) Appl. No.: 12/512,820

(22) Filed: Jul. 30, 2009

(65) Prior Publication Data

US 2010/0031119 A1 Feb. 4, 2010

Related U.S. Application Data

(60) Provisional application No. 61/086,081, filed on Aug. 4, 2008, provisional application No. 61/086,097, filed on Aug. 4, 2008.

(51) Int. Cl.
*H03M 13/00* (2006.01)

(52) U.S. Cl. ........ 714/755; 375/262; 375/341; 714/786; 714/794

(58) Field of Classification Search .......... 714/755, 714/786, 752, 758, 763, 780, 792, 794–795; 375/262, 341
See application file for complete search history.

(56) References Cited

U.S. PATENT DOCUMENTS

| | | | |
|---|---|---|---|
| 7,669,109 B2 * | 2/2010 | Hocevar | 714/780 |
| 2004/0255229 A1 * | 12/2004 | Shen et al. | 714/792 |
| 2005/0283707 A1 * | 12/2005 | Sharon et al. | 714/758 |
| 2008/0222487 A1 * | 9/2008 | Matsumoto | 714/758 |

OTHER PUBLICATIONS

R. Gallagher, Low-Density Parity-Check Codes, Cambridge, MA: MIT Press, 1963.
R. G. Gallagher, "Low density parity check codes," IRE Trans. Info. Theory, vol. IT-8, Jan. 1962, pp. 21-28.
M. G. Luby, M. Mitzenmacher, M. A. Shokrollahi, D. A. Spielman, and V. Stemann, "Practical Loss-Resilient Codes," Proc. 29th Symp. on Theory of Computing, 1997, pp. 150-159.
T. J. Richardson and R. L. Urbanke, "The capacity of low-density parity-check code under message-passing decoding," IEEE Trans. Inform. Theory, vol. 47, No. 2, Feb. 2001, pp. 599-618.
Anastasopoulos, A., "A comparison between the sum-product and the min-sum iterative detection algorithms based on density evolution," IEEE Global Telecommunications Conference, vol. 2, No. 25-29, Nov. 2001, pp. 1021-1025.
Hocevar, D.E., "A reduced complexity decoder architecture via layered decoding of LDPC codes," IEEE Workshop on Signal Processing Systems, 2004, pp. 107-112.

(Continued)

*Primary Examiner* — Guy Lamarre
(74) *Attorney, Agent, or Firm* — Garlick & Markison; Shayne X. Short

(57) ABSTRACT

Permuted accelerated LDPC (Low Density Parity Check) decoder. This decoding approach operates by processing, in parallel, selected rows for multiple individual LDPC matrix rows from various sub-matrix rows (e.g., first group of rows from a first sub-matrix row, second group of rows from a second sub-matrix row, etc.). A memory structure of daisy chains is employed for memory management of APP (a posteriori probability) values and also for check edge messages/intrinsic information ($\lambda$) values. A first group of daisy chains may be employed for memory management of the APP values, and a second group of daisy chains may be employed for memory management of the check edge messages. These daisy chains operate to effectuate the proper alignment of APP (or gamma($\gamma$)) values and check edge message/intrinsic information ($\lambda$) values for their respective updating in successive decoding iterations.

20 Claims, 12 Drawing Sheets

OTHER PUBLICATIONS

Karkooti, M., and Cavallaro, J.R., "Semi-parallel reconfigurable architectures for real-time LDPC decoding," Proceedings of the International Conference on Information Technology: Coding and Computing, vol. 1, 2004, pp. 579-585.

Mansour, M.M., and Shanbhag, N.R., "Low-power VLSI decoder architectures for LDPC codes," Proceedings of the 2002 International Symposium on Low Power Electronics and Design, 2002, pp. 284-289.

* cited by examiner

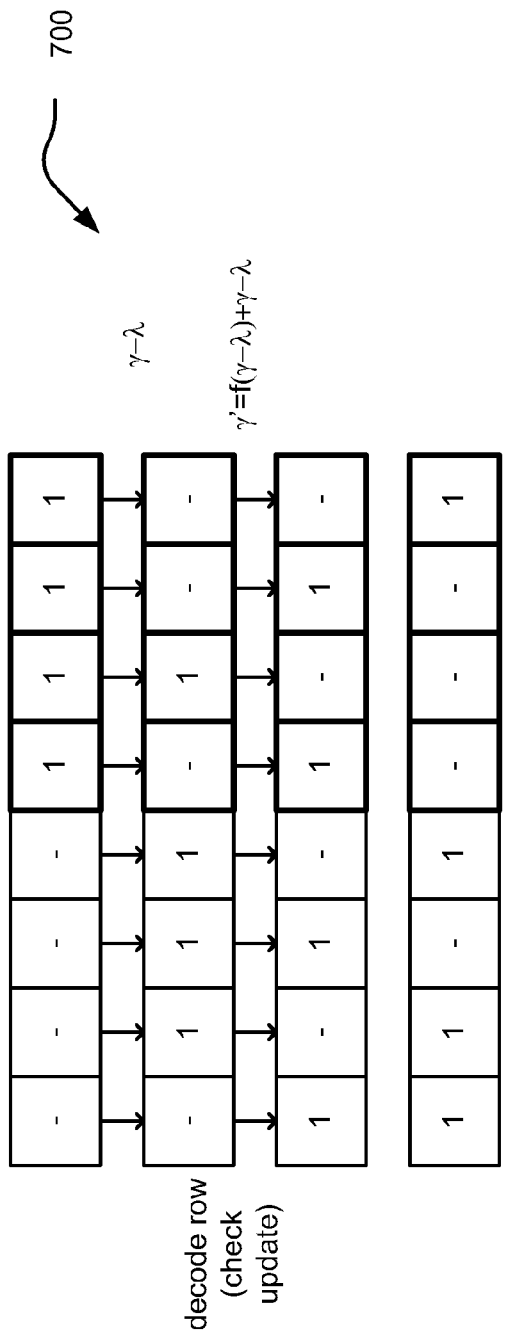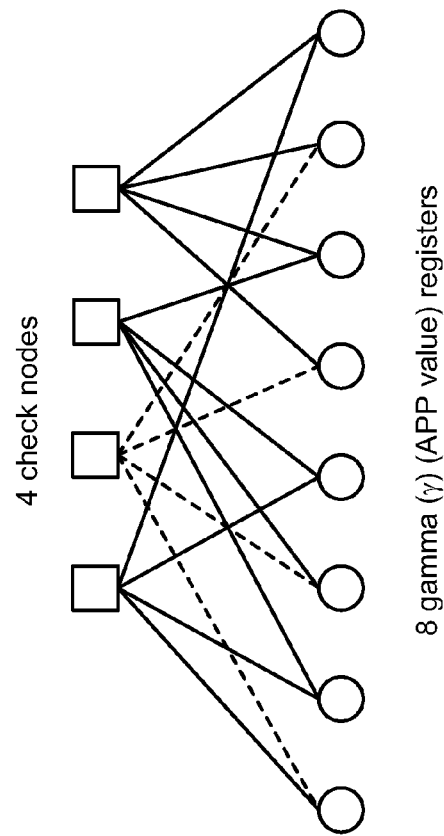
Fig. 7

Fig. 8 (layered, Z check modules, one sub-matrix row per cycle)

Fig. 9 (permuted accelerated)

PERMUTED ACCELERATED LDPC (LOW DENSITY PARITY CHECK) DECODER

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Application Ser. No. 61/086,081, entitled "Accumulating LDPC (Low Density Parity Check) decoder," filed Aug. 4, 2008.

2. U.S. Provisional Application Ser. No. 61/086,097, entitled "Permuted accelerated LDPC (Low Density Parity Check) decoder," filed Aug. 4, 2008.

Incorporation by Reference

The following U.S. Utility Patent Applications are hereby incorporated herein by reference in their entirety and made part of the present U.S. Utility Patent Application for all purposes:

1. U.S. patent application Ser. No. 11/828,532, entitled "Distributed processing LDPC (Low Density Parity Check) decoder," filed Jul. 26, 2007, pending, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Application Ser. No. 60/958,014, entitled "Distributed processing LDPC (Low Density Parity Check) decoder," filed Jul. 2, 2007.

2. U.S. patent application Ser. No. 11/843,553, entitled "Multi-code LDPC (Low Density Parity Check) decoder," filed Aug. 22, 2007, pending, which claims priority pursuant to 35 U.S.C. §119(e) to the following U.S. Provisional Patent Applications which are hereby incorporated herein by reference in their entirety and made part of the present U.S. Utility Patent Application for all purposes:

a. U.S. Provisional Application Ser. No. 60/958,014, entitled "Distributed processing LDPC (Low Density Parity Check) decoder," filed Jul. 2, 2007.

b. U.S. Provisional Application Ser. No. 60/954,182, entitled "Multi-code LDPC (Low Density Parity Check) decoder," filed Aug. 6, 2007.

3. U.S. patent application Ser. No. 12/512,490, entitled "Accumulating LDPC (Low Density Parity Check) decoder," filed concurrently on Jul. 30, 2009, pending.

BACKGROUND OF THE INVENTION

1. Technical Field of the Invention

The invention relates generally to an architecture including one or more daisy chains as implemented for use in a communication device; and, more particularly, it relates to an architecture including one or more daisy chains for use in a communication device that is operative to decode LDPC (Low Density Parity Check) coded signals within a communication system.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 7 illustrates an embodiment of sub-matrix based decoding of an LDPC coded signal using APP (a posteriori probability) (or gamma ($\gamma$)) and check edge message ($\lambda$) updating.

DETAILED DESCRIPTION OF THE INVENTION

Communication systems have been around for some time, and their presence into modern life is virtually ubiquitous (e.g., television communication systems, telecommunication systems including wired and wireless communication systems, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
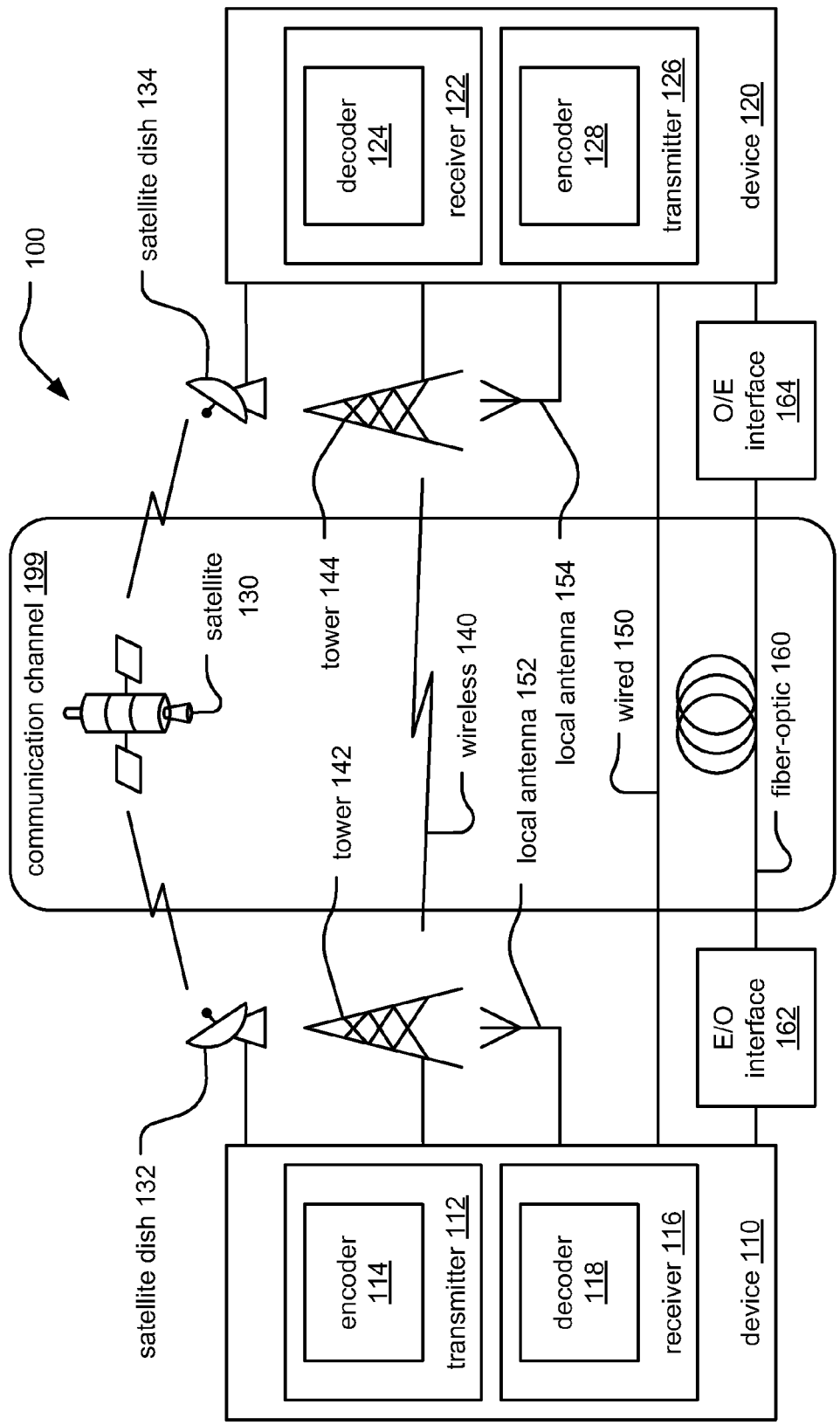
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
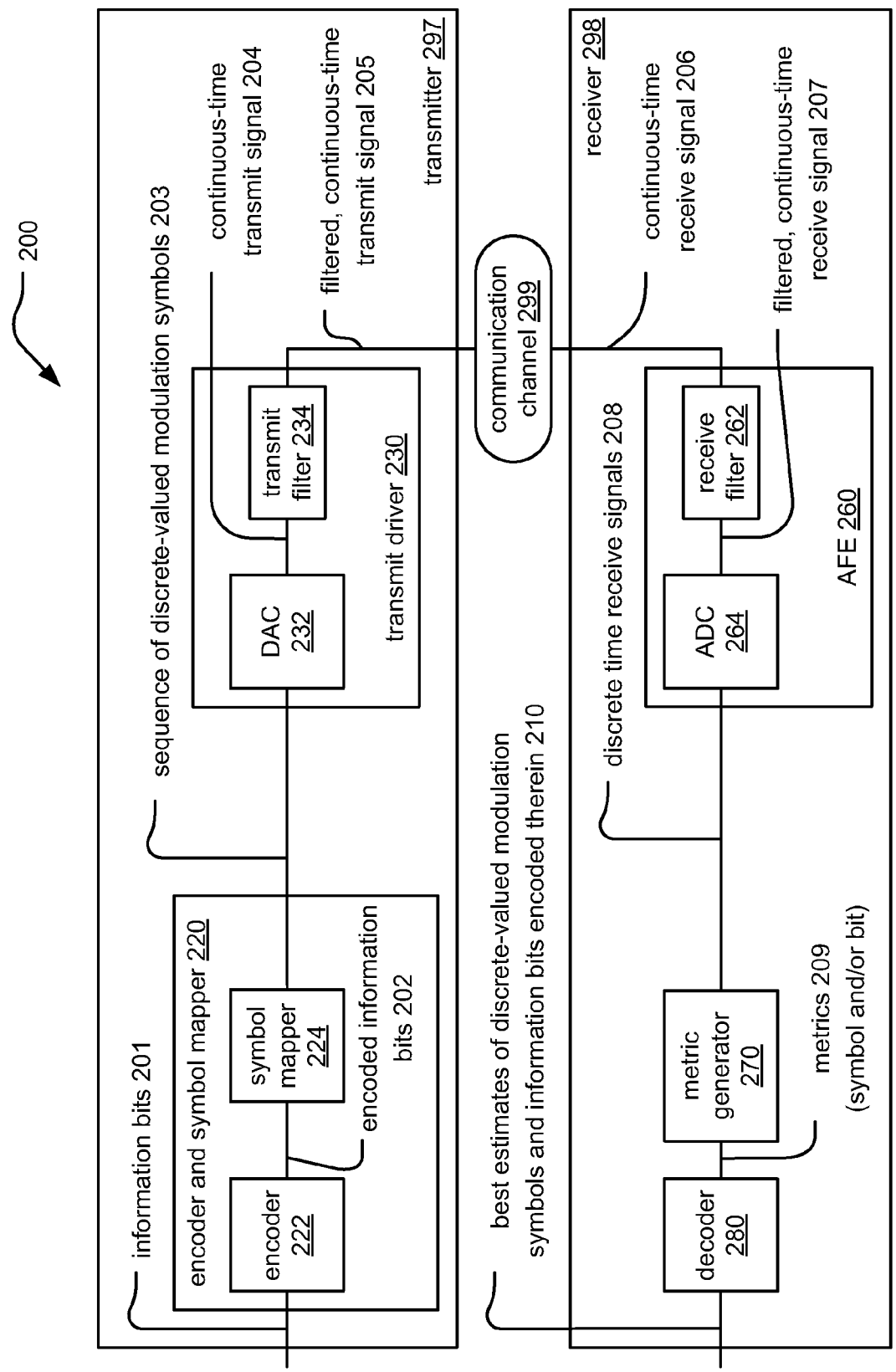

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
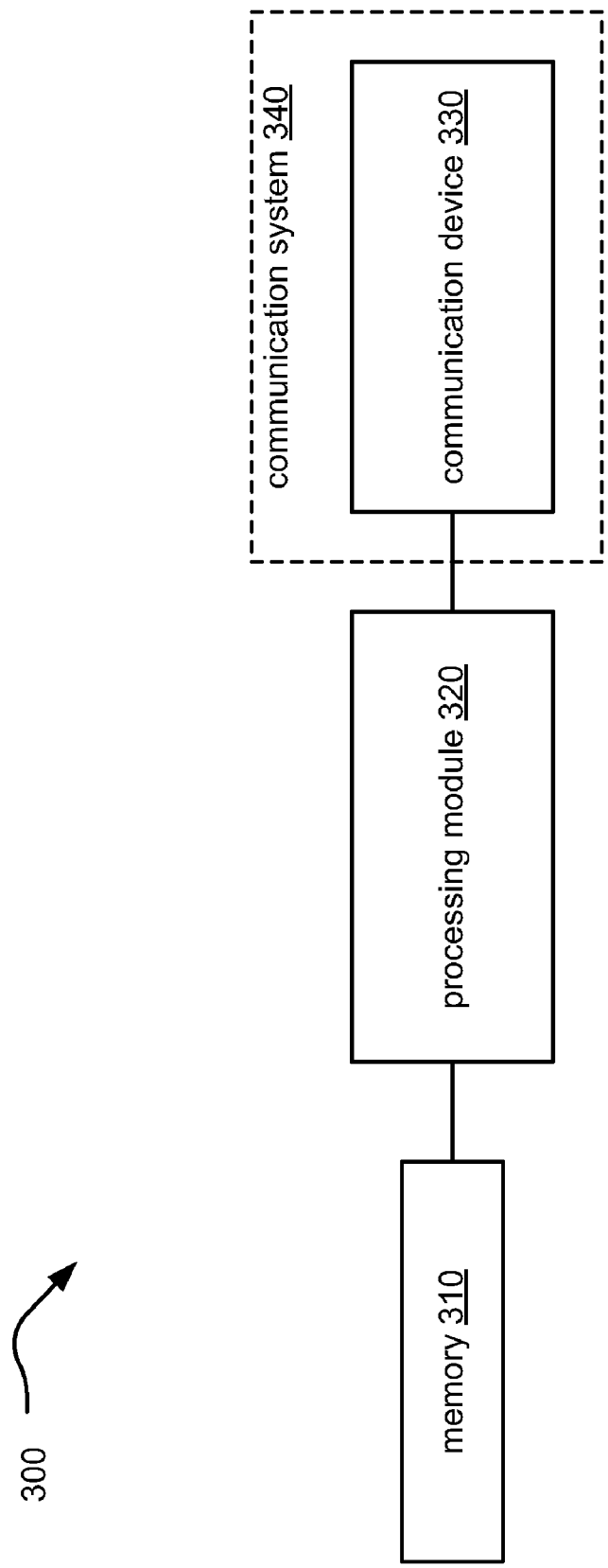
FIG. 3 illustrates an embodiment of an apparatus that is operable to perform LDPC decoding processing and/or LDPC code construction.

FIG. 3 illustrates an embodiment of an apparatus 300 that is operable to perform LDPC decoding processing and/or LDPC code construction. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which various LDPC codes may be constructed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of all-zero-valued sub-matrices, the cyclic shift (if any) of any sub-matrix within an LDPC matrix, etc.) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within any desired such communication system 340 as well.

If desired, the apparatus 320 can be designed to generate multiple means of constructing LDPC codes in accordance with multiple needs and/or desires as well. In some embodiments, the processing module 320 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 320 can also provide the same information to each of different communication devices and/or communication systems as well without departing from the scope and spirit of the invention.

Figure 4:
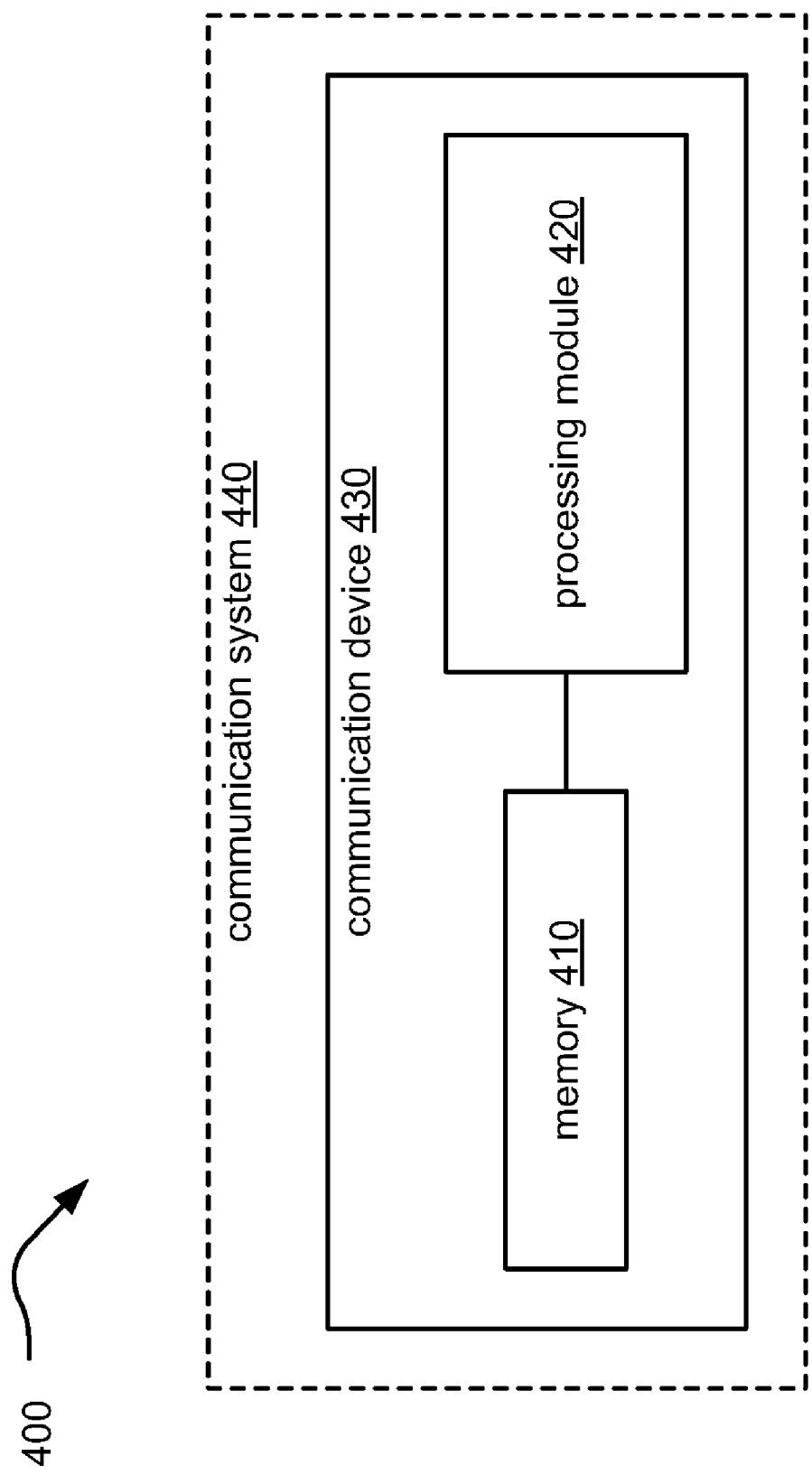
FIG. 4 illustrates an alternative embodiment of an apparatus that is operable to perform LDPC decoding processing and/or LDPC code construction.

FIG. 4 illustrates an alternative embodiment of an apparatus that is operable to perform LDPC decoding processing and/or LDPC code construction. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC code construction is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
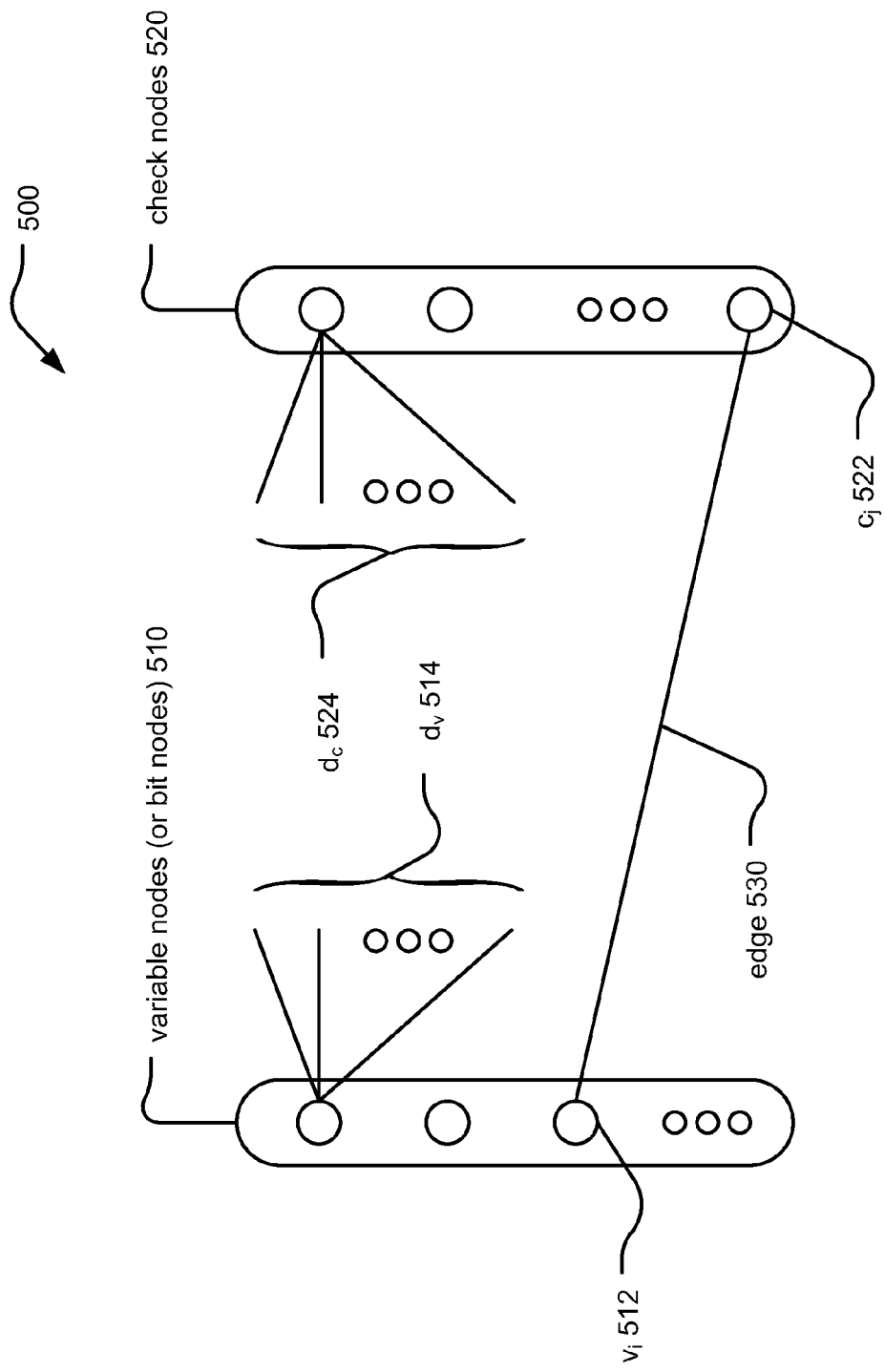
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{ji}$ indicates that an edge connects a bit (e.g., variable ) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Herein, a methodology is presented by which a large number of LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 6:
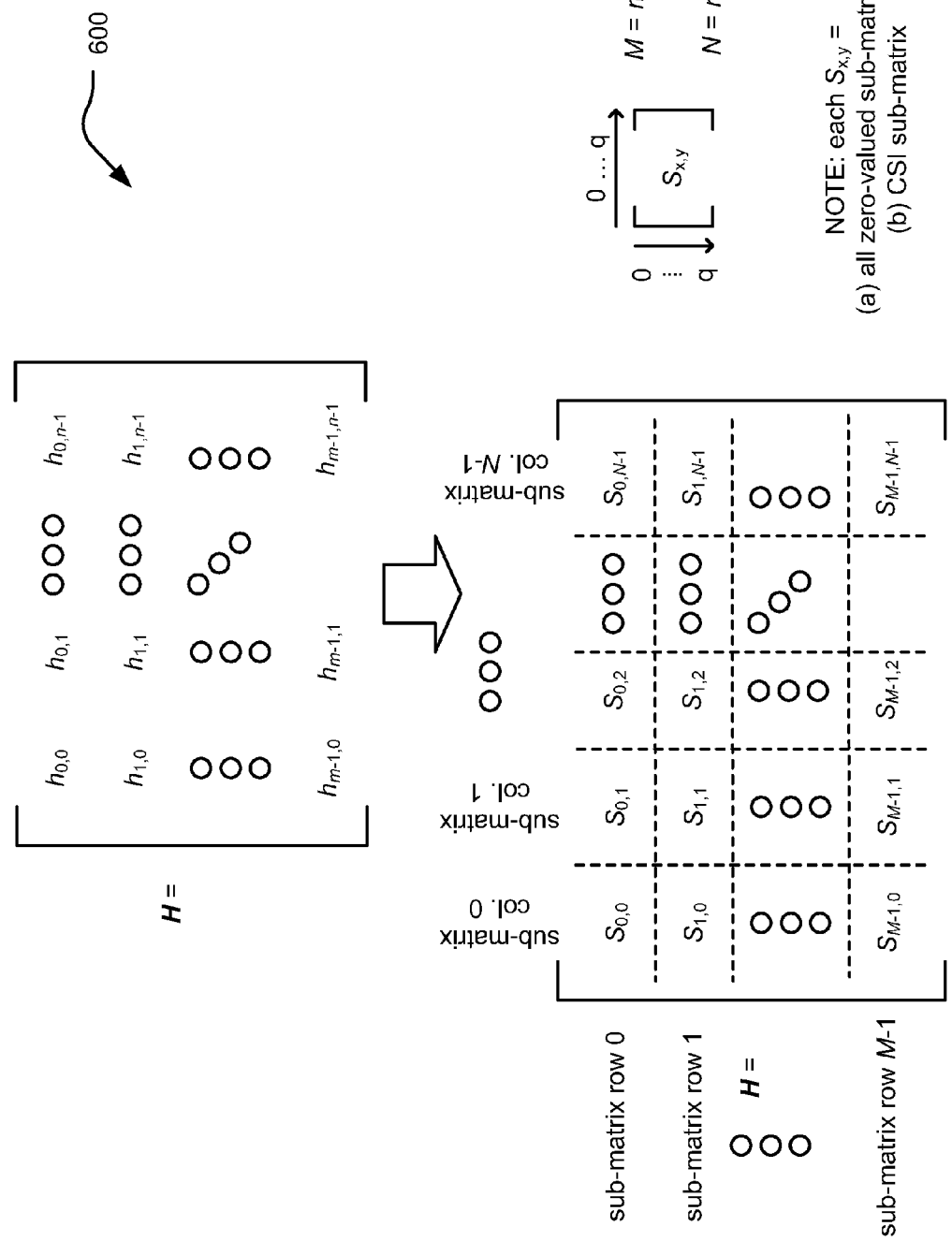
FIG. 6 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 6 illustrates an embodiment 600 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 6, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c is a codeword (i.e., of the LDPC code) if and only if Hc=0.

For such an LDPC code, the parity matrix H is also composed of a number of q-by-q (i.e., q×q) square sub-matrices as shown in the bottom portion of FIG. 6 and also below:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j \pmod{q} \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

FIG. 7 illustrates an embodiment 700 of sub-matrix based decoding of an LDPC coded signal using APP (a posteriori probability) (or gamma ($\gamma$)) and check edge message ($\lambda$) updating.

A novel LDPC decoder architecture is presented herein that provides for accelerated decoding performance when compared with designs that implement standard belief propagation (BP) decoding approach (i.e., it provides for a greater coding gain with the same number of decoder iterations or equivalent coding gain with fewer decoder iterations that prior art approaches). In addition, this novel decoding architecture can be effectively pipelined while incurring a minimal coding gain loss to increase a decoder's throughput increase and also to reduce the decoder area (i.e., size, real estate, footprint when implemented in hardware).

The novel LDPC decoder architecture described herein is applicable to LDPC codes operating on a parity check matrix, H, consisting of CSI (Cyclic Shifted Identity) sub-matrices (or matrix sub-blocks) or permuted identity sub-matrices (or matrix sub-blocks). In such a structure, the entire LDPC matrix is broken into square sub-matrices such that each sub-matrix consists of either a CSI sub-matrix or a permuted identity sub-matrix, or a null matrix (i.e., an all zero-valued sub-matrices in which all elements therein have a value of 0). LDPC matrices having such a structure can be found in a variety of applications including those that comply with the IEEE 802.11n and IEEE 802.16e standards, among other application areas.

Traditional decoding of LDPC code signals is based on the belief propagation (BP) decoding approach [as described by R. Gallager in [1] referenced above (also in [2] referenced above). For the BP decoding approach, each iteration has distinct check and variable (or bit) update phases. All the check nodes are updated before all variable nodes are updated and vice-versa. This can yield reliable decoding performance down to extremely low packet error rates (e.g. $10^{-12}$).

There is at least another manner in which LDPC decoding may be performed besides the standard belief propagation (BP) decoding approach. Another approach involves APP (a posteriori probability) (or gamma ($\gamma$)) and check edge message ($\lambda$) updating as opposed to bit edge message and check edge message updating.

In this LDPC decoding that employs APP (or gamma ($\gamma$)) updating, the variable and check update operations may be combined to provide for even faster decoding. One approach that capitalizes on the use of APP (or gamma ($\gamma$)) updating is referred to as layered decoding as described by Hocevar in reference [5].

[5] Hocevar, D. E., "A reduced complexity decoder architecture via layered decoding of LDPC codes," *IEEE Workshop on Signal Processing Systems,* 2004, pp. 107-112.

In this layered decoding approach, performance at extremely low packet error rates is sacrificed to achieve faster convergence (e.g., fewer decoding iterations). In addition, a relatively higher coding performance is achieved at higher packet error rates in the range 0.01% to 10%. Layered decoding operates by performance all the check updates for a given sub-matrix (or sub-block) row in parallel followed by a partial (or simplified) variable node update. The posterior information about each decoded bit from each sub-matrix (or sub-block) row update is passed to the next sub-matrix (or sub-block) row update yielding faster decoder convergence.

Stated another way, layered LDPC decoding operates by separately decoding each sub-matrix row of an LDPC matrix and then passing the APP (or gamma ($\gamma$)) values from the entire sub-matrix row to the next sub-matrix row. This can be viewed as propagating the APP (or gamma ($\gamma$)) values forward/down through the sub-matrix rows of the LDPC matrix. In accordance with layered LDPC decoding approach, a particular sub-matrix row must be completely finished (e.g., decoded) before its corresponding APP (or gamma ($\gamma$)) values can be employed and considered for use in a subsequent sub-matrix row.

By employing this decoding approach (vs. the BP decoding approach), a simple APP (or gamma ($\gamma$)) update is performed instead of the variable node update (as employed in BP decoding approach). It is noted, however, that the APP (or gamma ($\gamma$)) values and the intrinsic information values ($\lambda$) (e.g., which are analogous to the check edge messages in the BP decoding approach) are stored (e.g., in memory, registers, and/or daisy chains, etc.).

This layered decoding approach that employs APP (or gamma ($\gamma$)) update can converge faster than the BP decoding approach, and as such, it can effectuate a higher coding code for a comparable number of decoding iterations when compared to the BP decoding approach. However, as is described herein, there is no manner by which the layered decoding approach can be pipelined unless a significant reduction in coding gain in acceptable. In other words, to achieve a relatively high throughput of the data path flow within a layered decoder necessarily requires the inclusion of additional hardware (e.g., logic gates, etc.), and this necessary footprint of the hardware is much larger than would otherwise be the case because more computation must be done in parallel. The necessary use of such additional hardware for routing, alignment, etc. (e.g., logic gates, etc.) cannot be of minimal size.

Figure 8:
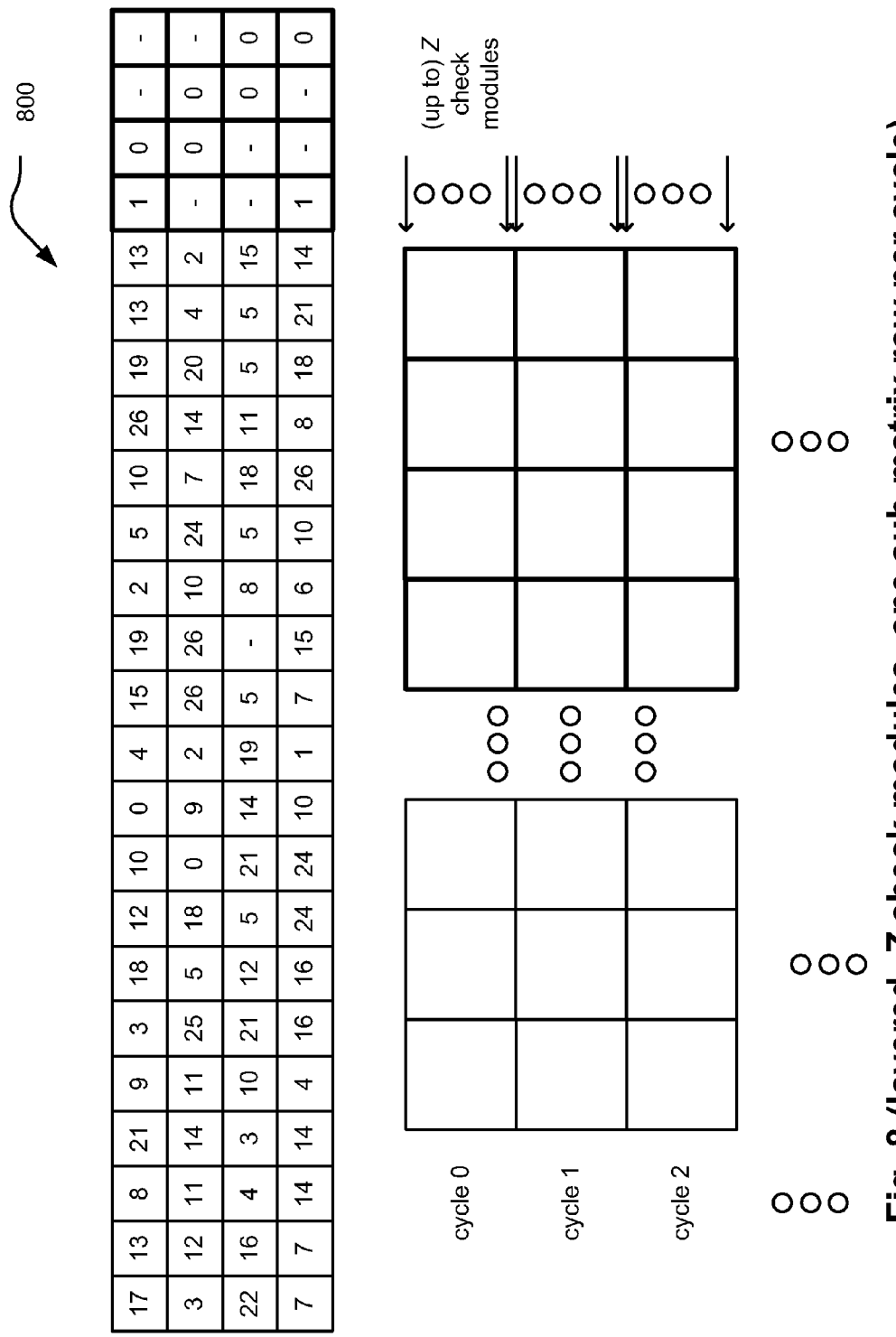
FIG. 8 illustrates an embodiment of layered decoding of an LDPC coded signal.

FIG. 8 illustrates an embodiment 800 of layered decoding of an LDPC coded signal. As can be seen, a number of check modules (e.g., up to Z) are employed so that all rows of a sub-matrix row of the LDPC matrix are processed simultaneously (all rows of the top sub-matrix row during cycle 0, all rows of the $2^{nd}$ to top sub-matrix row during cycle 2, all rows of the $3^{rd}$ to top sub-matrix row during cycle 2, etc.).

In this embodiment as well as others, each sub-matrix of the depicted LDPC matrix is a CSI (Cyclic Shifted Identity) sub-matrix that is characterized by a shift-value, $\lambda(S)$. For example, the top left hand sub-matrix has a value of 17, and is therefore a CSI sub-matrix with a shift-value of 17, $\lambda(17)$. All of the sub-matrices depicted as a "–" are all zero-valued sub-matrices (i.e., all elements of such a sub-matrix are a value of 0, and this may also be referred to as a null sub-matrix). When a sub-matrix has a value of 0, that CSI sub-matrix has a shift-value of 0, $\lambda(0)$, and may be viewed as being an identity sub-matrix.

Figure 9:
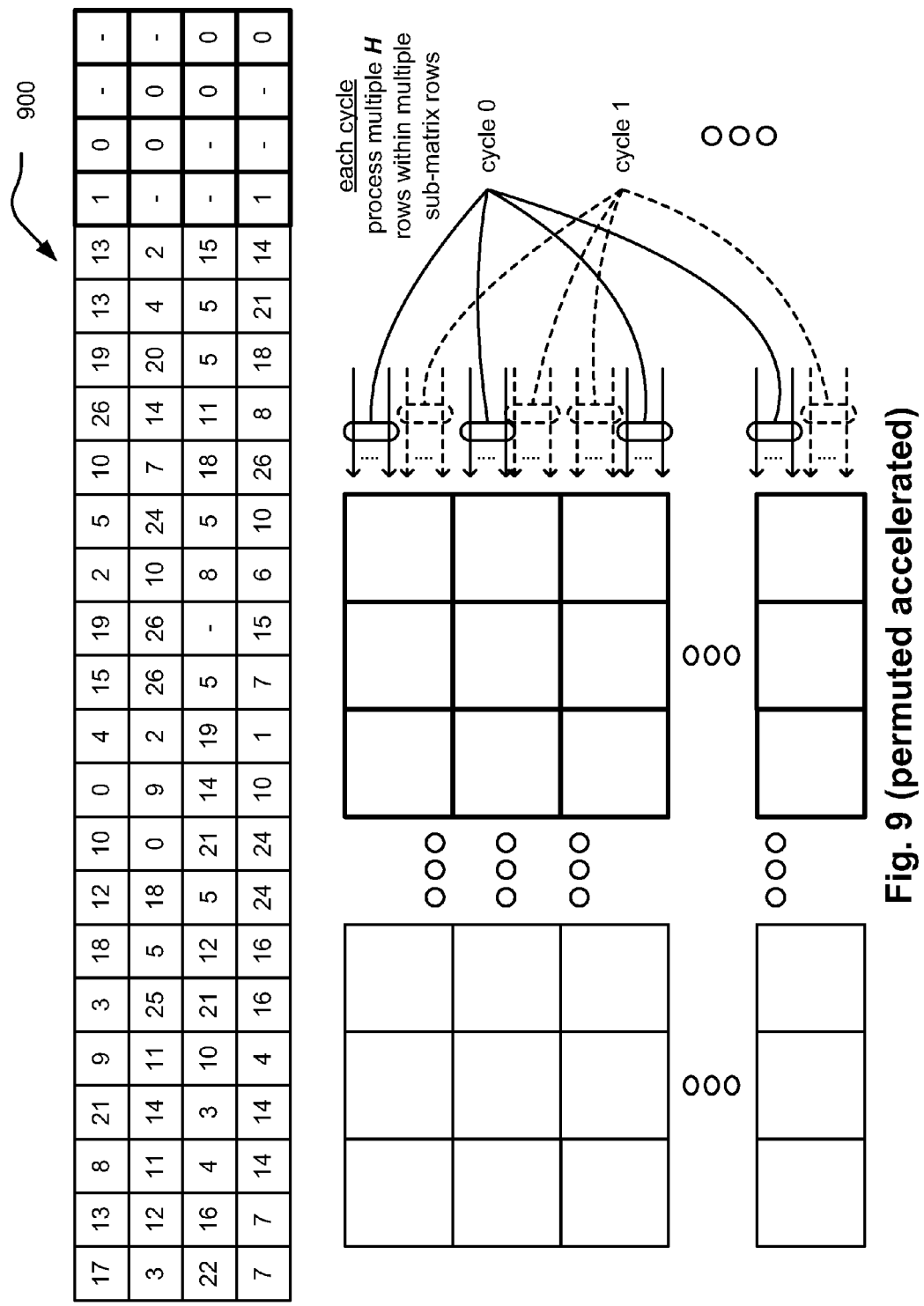
FIG. 9 illustrates an embodiment of permuted accelerated decoding of an LDPC coded signal.

FIG. 9 illustrates an embodiment 900 of permuted accelerated decoding of an LDPC coded signal. In contrast to the layered decoding approach as described above in which all rows of a sub-matrix are processed simultaneously, the permuted accelerated decoding approach operates by processing multiple individual rows of the LDPC matrix located within multiple sub-matrix rows in a given cycle. For example, in this embodiment, during a cycle 0, selected rows within each of the sub-matrix rows of the LDPC matrix are processed simultaneously. Analogously, during a cycle 1, selected rows within each of the sub-matrix rows of the LDPC matrix are processed simultaneously, and so on. It is noted that the same selected rows from each sub-matrix need not be processed simultaneously. For example, during the cycle 0, in the top sub-matrix row, rows 1 to x may be processed, while in the second to top sub-matrix row, rows b to b+x may be processed, and so on. In other words, within a given sub-matrix row, a first offset from the top row therein to the selected individual rows of that sub-matrix row that are being processed during a given cycle may be different than a second offset corresponding to the selected individual rows of another sub-matrix row.

In accordance with permuted accelerated LDPC decoding, the computation of the check updates ($\lambda$) is performed in a different order than that as performed in accordance with the layered decoding (e.g., as in FIG. 8). Rather than processing an entire sub-matrix (or sub-block) row of check updates simultaneously as in layered decoding (e.g., as in FIG. 8), multiple individual rows within each of the sub-matrix rows (or all sub-matrix or sub-block rows) are processed in parallel. The amount of parallelism is specified by the designer. In this embodiment, a number of check modules may be implemented to operate on a number of individual rows spanning across multiple sub-matrix rows (or all sub-matrix or sub-block rows) in parallel.

In contrast, when performing the layered decoding approach, a sub-matrix row is processed by the processing unit. After the sub-matrix row is entirely processed, the processing unit moves onto the next sub-matrix row, and so on through the LDPC matrix. A decoding iteration is considered to be completed only when the processing unit has processed all the sub-matrix rows of the LDPC matrix.

Herein, the permuted accelerated decoding approach operates by processing, in parallel, selected rows for multiple individual LDPC matrix rows from various sub-matrix rows to increase throughput and/or increase the number of iterations that may performed within a same period of time. In addition, a memory structure of daisy chains may be employed to decrease the routing congestion of the permuted accelerated decoding architecture and to obviate the need for the additional multiplexers, barrel shifters (BSs), and routing congestion inherent to the layered decoding approach.

In one embodiment, the permuted accelerated decoding approach performs several calculations in parallel in each sub-matrix row of the LDPC matrix. The amount of parallelism desired may be specified by the designer. This may be selected to be an integer divisor of the sub-matrix size (e.g., integer divisor of the size of the square sub-matrices of the LDPC matrix).

Every sub-matrix row in the LDPC matrix performs the same number of calculations simultaneously. In permuted accelerated decoding, only one element in each column is processed at any given time. In order to satisfy this constraint, offset values may be employed on the processors in order to avoid conflicts. These offsets can be determined with a desired type of search prior to implementing an architecture in hardware.

Moreover, the memory units employed for the reliability messages (e.g., APP (a posteriori probability) (or gamma ($\gamma$)) values) may be implemented as daisy chained registers. This allows the connections to the processing nodes to be implemented as a single set of wires. The intentionally offset processing nodes (e.g., for APP (or gamma ($\gamma$)) value update/calculation) and intrinsic offsets (e.g., for check edge message ($\lambda$) update/calculation) from the structure of the LDPC matrix can be implemented by offsetting the processing node's connection in the daisy chained registers. This eliminates all multiplexing and interconnection networks (e.g., it obviates the additional multiplexers, BSs, and routing congestion inherent to the layered decoding approach).

The permuted accelerated decoding approach does not suffer from the routing and congestion issues that typically plague prior art LDPC decoders. In addition, throughput of a permuted accelerated decoder can be arbitrarily scaled up or down depending on the system requirements. This scaling has little impact on routing complexity.

The parallel processing approach to the problem eliminates the BSs, interconnection networks, and multiplexers from this design. It also allows direct connections between registers and combinational logic to perform the decoding. In addition, the daisy chain topology of memory structures allows arbitrary parallelism without adding additional hardware and connections.

Figure 10:
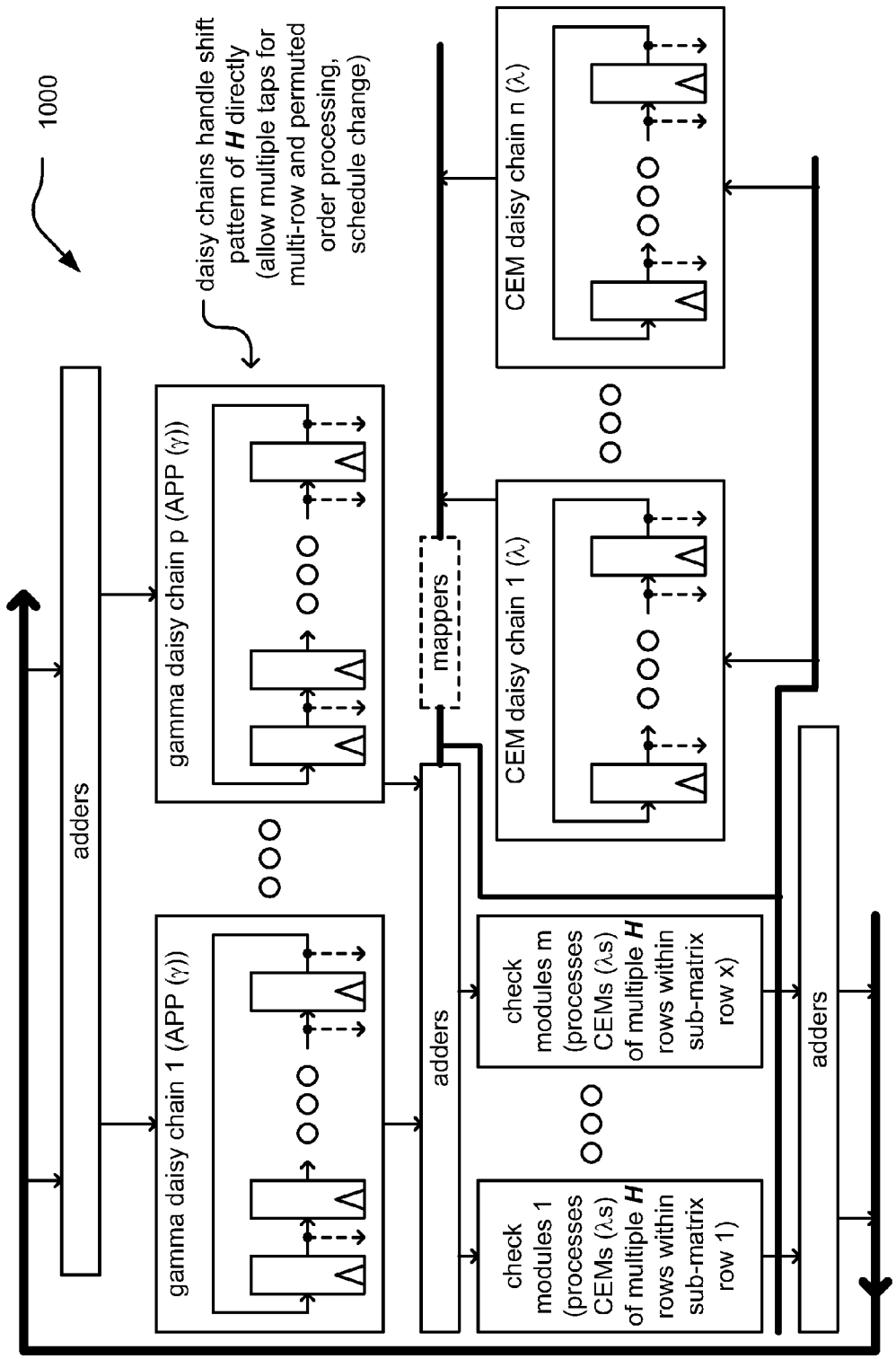
FIG. 10 illustrates an embodiment of the data path flow as employed within permuted accelerated decoding.

FIG. 10 illustrates an embodiment 1000 of the data path flow as employed within permuted accelerated decoding. If desired when performing permuted accelerated decoding, the decoding process may be implemented differently when decoding of an LDPC coded signal (e.g., than is typically employed in accordance with layered decoding). When using this approach, these differences ensure that the problems encountered with the updating of consecutive an APP (or gamma($\gamma$)) values are avoided. The APP (or gamma($\gamma$)) value update calculation, in accordance with accumulating decoding, is different, in that, the decoding processing is performed as a function of change in an APP (or gamma($\gamma$)) value, which may be viewed as calculating the value ($\Delta\gamma$).

For example, the update of an APP (or gamma($\gamma$)) value is performed as follows:

$\gamma' = \lambda' + (\gamma - \lambda)$, where $\lambda' = \text{chk}(\gamma - \lambda)$, and where $\gamma'$ is the updated/calculated value of the APP (or gamma($\gamma$)) value;

$\lambda'$ is the updated/calculated value of the check edge message;

γ is the previous/prior value of the APP (or gamma(γ)) value; and

λ is the previous/prior value of the check edge message.

Therefore, the change in an APP (or gamma(γ)) value (i.e., Δγ) may then be calculated as follows:

$$\Delta\gamma = \gamma' - \gamma$$

$$\Delta\gamma = \gamma' - \gamma$$

$$\rightarrow \Delta\gamma = \lambda' + (\gamma - \lambda) - \gamma = \lambda' - \lambda.$$

Therefore, it can be seen that the change in an APP (or gamma(γ)) value (i.e., Δγ) may then be calculated as follows:

$$\gamma' = \gamma + \Delta\gamma.$$

Also, the change in an APP (or gamma(γ)) value (i.e., Δγ) may then be calculated as follows (which is a function of differences in current/updated and previous/prior check edge messages):

$$\Delta\gamma = \lambda' - \lambda.$$

This calculation of the individual contributions of the change in an APP (or gamma(γ)) value (i.e., Δγ) allows for an effective pipelining in accordance with permuted accelerated decoding.

During both the layered and permuted accelerated decoding approaches, a signed value may be maintained for each column of the matrix corresponding to the best estimate of the log-likelihood ratio (LLR) of each codeword bit (i.e., APP (or gamma(γ)).

In the layered decoding approach, each check update computes a new LLR value (i.e., APP (or gamma(γ)) based on its value prior to the current update. If the check updates (λs) are pipelined, a coding gain loss may be incurred if the same LLR value must be updated on consecutive clock cycles. In accordance with layered decoding, this is because the contribution of one or more of the check updates will be lost and not incorporated into the results of subsequent check updates.

However, in contrast, when performing permuted accelerated decoding as described herein, each check update can be performed by computing and adding the incremental change to the LLR value (i.e., Δγ) based on its value prior to the current update (i.e., γ'=γ+Δγ). If the check updates (λs) are pipelined, then the contribution from the check updates in consecutive cycles can still be incorporated into the final LLR value (i.e., no updates are lost). This will result in almost no coding gain loss when the permuted accelerated decoder is pipelined.

It is also noted that the check edge message update as employed in accordance with the permuted accelerated decoding approach can employ any of a wide variety of processing means. For example, the permuted accelerated LDPC decoder architecture can be used with almost any check node update type, including sum-product, min* (min-star), min** (min-double-star), min-sum [as described by Anastasopoulos in reference [6]], modified min-sum [as described by Karkooti in reference [7]], and BCJR [as described by Mansour in reference [8], and/or any other desired means of performing check edge message updating. The appropriate computation type can be chosen based on the area, latency, and coding gain requirements of the application.

[6] Anastasopoulos, A., "A comparison between the sum-product and the min-sum iterative detection algorithms based on density evolution," *IEEE Global Telecommunications Conference*, Vol. 2, No. 25-29, November 2001, pp. 1021-1025.

[7] Karkooti, M., and Cavallaro, J. R., "Semi-parallel reconfigurable architectures for real-time LDPC decoding," *Proceedings of the International Conference on Information Technology: Coding and Computing*, Vol. 1, 2004, pp. 579-585.

[8] Mansour, M. M., and Shanbhag, N. R., "Low-power VLSI decoder architectures for LDPC codes," *Proceedings of the 2002 International Symposium on Low Power Electronics and Design*, 2002, pp. 284-289.

However, it is noted that this approach of using change in an APP (or gamma(γ)) value (i.e., Δγ) to effectuate LDPC decoding need not be employed, and any manner of updating APP (or gamma(γ)) values may be performed without calculating the incremental contributions of each individual (Δγ) (e.g., a straightforward updating of (γ) to generate (γ') may be performed without using (Δγ)).

Referring again to FIG. 10, two separate groups of daisy chains (e.g., daisy chained registers) are employed to store the APP (or gamma(γ)) values and the check edge message/intrinsic information (λ) values. The use of these daisy chains obviates the need for extensive multiplexers, barrel shifters (BSs), extensive routing, etc. as needed within prior art LDPC decoding architectures. The use of the daisy chains allows multiple individual rows of multiple sub-matrix rows of the LDPC matrix to be processed at a time. In contrast, some prior art approaches would employ extensive memory devices (e.g., RAM) which generally preclude the possibility of processing more than one sub-matrix row at a time (e.g., as performed in layered decoding). The prior art decoding approaches (e.g., layered) necessitates the use of extensive memory, rotating address functionality (e.g., BSs), and/or multiplexers, etc. to effectuate the proper alignment of APP (or gamma(γ)) values and check edge message/intrinsic information (λ) values for their respective updating. Certain types of memory (e.g., RAM) simply cannot be parallelized.

However, when employing daisy chains as described herein, the daisy chain architecture inherently allows for multiple taps to be taken thereby allowing parallelization in the overall decoding architecture. These daisy chains can handle the shift pattern directly without necessitating the use of other means to do so (e.g., memory, BSs, multiplexers, etc.). Moreover, based on the connectivity of the daisy chains, the scheduling of which individual rows within various sub-matrix rows are to be processed can be accommodated. The use of daisy chains also allows the permuting of the order in which the permuted accelerated decoding is to be performed.

In the diagram, various groups of check modules (e.g., shown as check modules 1 to check modules m) are implemented to perform updating of the check edge message/intrinsic information (λ) values of multiple individual rows within respective sub-matrix rows of the LDPC matrix. After being updated, the check edge message/intrinsic information (λ) values are passed to check edge message daisy chains (shown as CEM daisy chain 1 (λ) to CEM daisy chain n (λ)). These updated check edge message/intrinsic information (λ) values are also passed to a first array of adders, the output of which is passed to a second array of adders from which the updated APP (or gamma(γ)) values are provided to the APP (or gamma(γ)) daisy chains (shown as gamma daisy chain 1 (APP(γ)) to gamma daisy chain p (APP(γ))). The outputs from the APP (or gamma(γ)) daisy chains pass through a third array of adders (that also receive appropriately mapped check edge message/intrinsic information (λ) values output from the check edge message daisy chains) and then the output from this third array of adders is passed back to the check modules. In some embodiments, an additional mapper or mappers is/are implemented between the check edge message daisy chains and the third array of adders to operate cooperatively with the check edge message daisy chains to effectuate the appropriate ordering/mapping of the check edge message/intrinsic information (λ) values for their use in the third array of adders.

When compared to layered decoding (e.g., as in FIG. 8) in which all of the rows of a particular sub-matrix are processed at a time, the permuted accelerated decoding processes multiple individuals rows from each of the sub-matrix rows simultaneously and does so without necessitating the use of extensive memory, rotating address functionality (e.g., BSs), and/or multiplexers, etc. to effectuate the proper alignment of APP (or gamma(γ)) values and check edge message/intrinsic information (λ) values for their respective updating. Certain types of memory (e.g., RAM) simply cannot be parallelized.

It is the daisy chains themselves that effectuate the appropriate alignment of APP (or gamma(γ)) values and check edge message/intrinsic information (λ) values for their respective updating in accordance with the permuted accelerated decoding. Again, the use of daisy chains also allows the option for having multiple taps taken there from which lends itself to multi-row, permuted order processing (e.g., different selected individual rows within various sub-matrix rows), schedule changing, etc. in accordance with permuted accelerated decoding.

Figure 11:
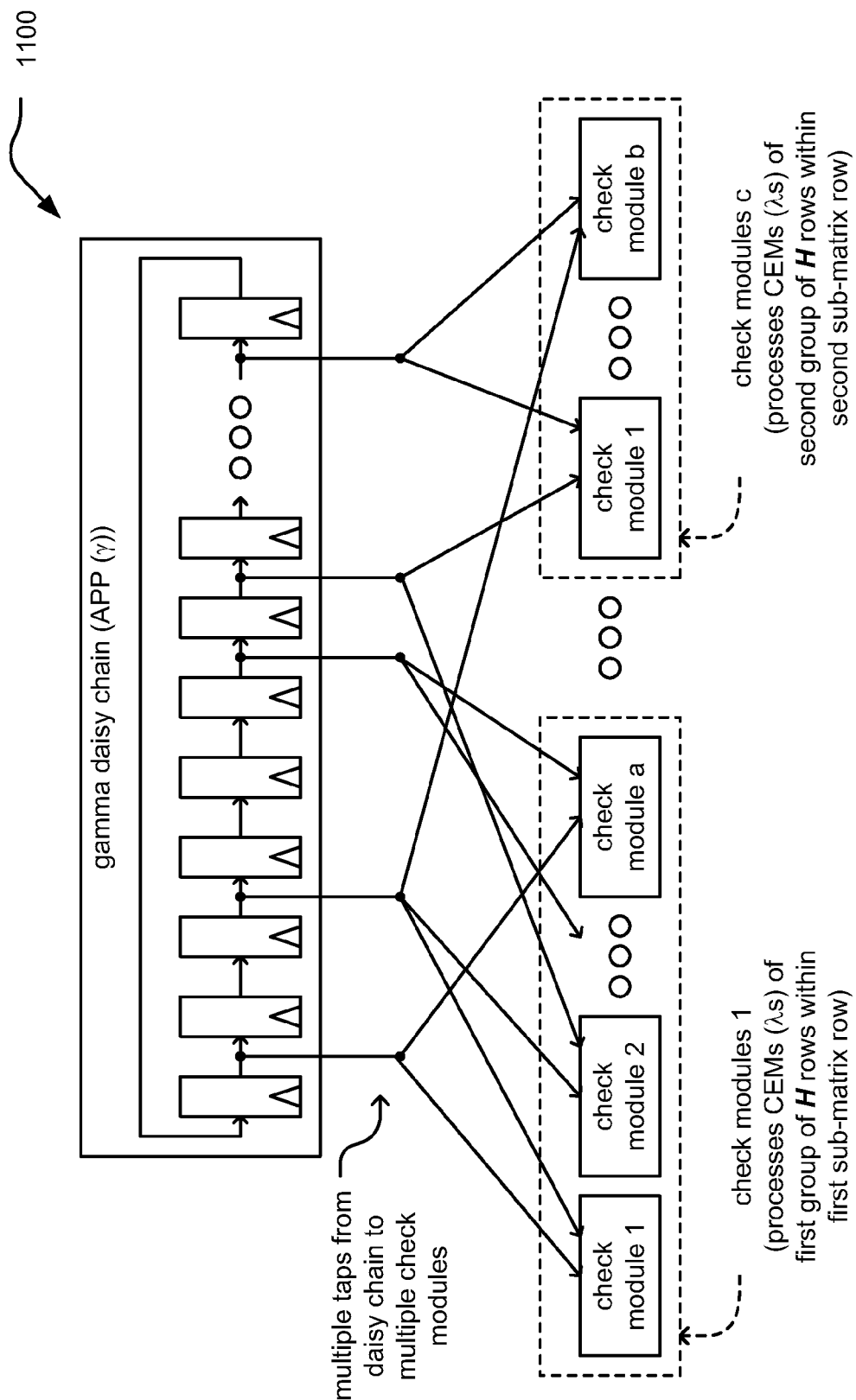
FIG. 11 illustrates a more detailed embodiment showing various connections from a daisy chain as employed within permuted accelerated decoding.

FIG. 11 illustrates a more detailed embodiment 1100 showing various connections from a daisy chain as employed within permuted accelerated decoding. This diagram shows how multiple taps take appropriately from various sections within a daisy chain (e.g., this embodiment shows APP (or gamma(γ)) daisy chains, though the principles are also applicable to check edge message daisy chains as well).

By tapping off from the various connections between the registers that compose the daisy chain, certain selected values of APP (or gamma(γ)) values may be appropriately provided to more than one group of check modules.

For example, as can be seen in the diagram, a particular tap from the daisy chain that provides a APP (or gamma(γ)) value may be simultaneously provided not only to more than one check module within a group of check modules, but it may also be provided to more than one check module within different groups of check modules (e.g., provided to a particular check module 1 located in the group "check modules 1" and also provided to a particular check module b located in the group "check modules c").

Again, the principles of multiple taps within a daisy chain can also be applied to check edge message daisy chains as well without departing from the scope and spirit of the invention.

Figure 12:
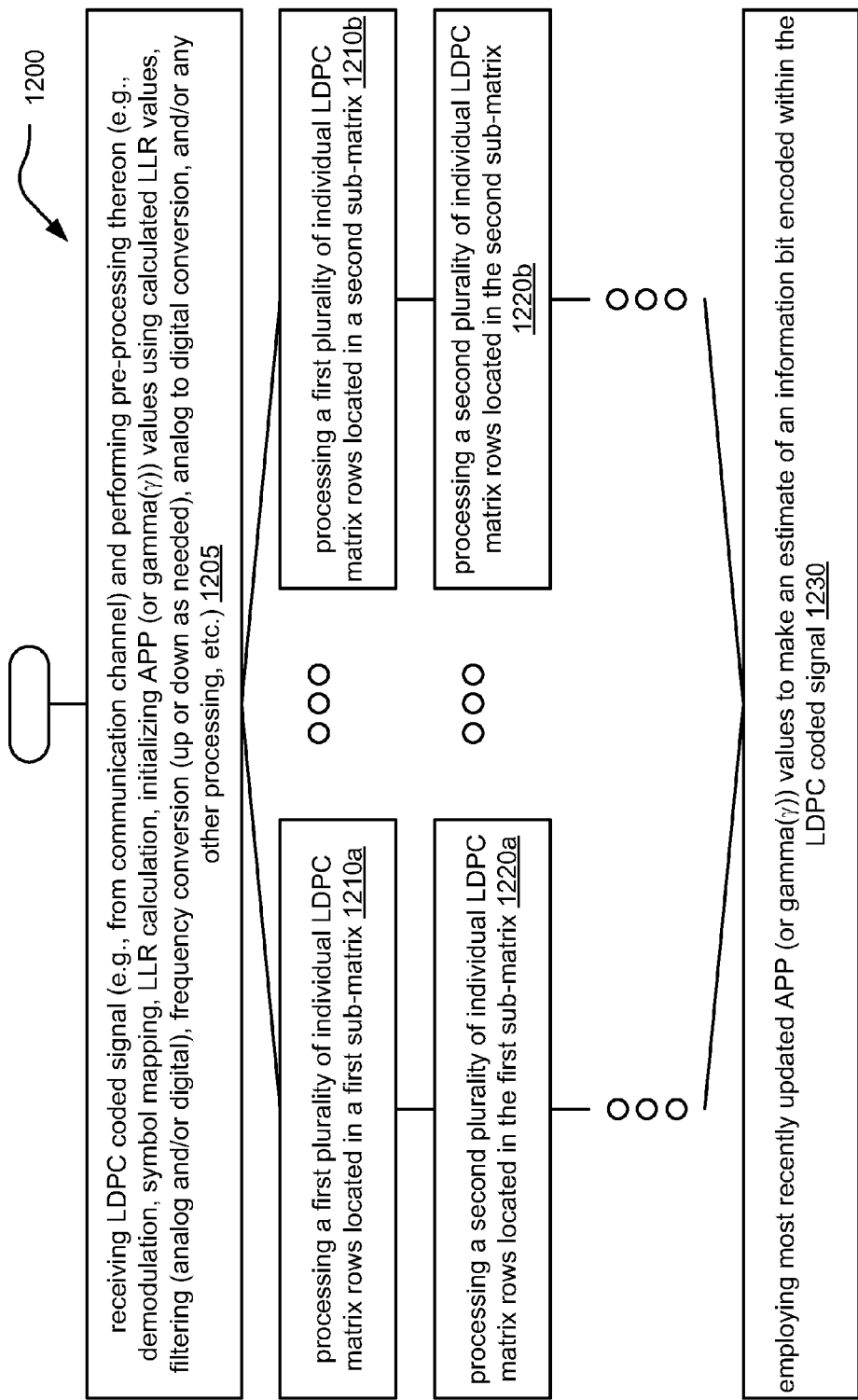
FIG. 12 illustrates an embodiment of a method for performing permuted accelerated decoding of an LDPC coded signal.

FIG. 12 illustrates an embodiment of a method 1200 for performing permuted accelerated decoding of an LDPC coded signal. Multiple individual rows of an LDPC matrix, spanning across various sub-matrix rows of the LDPC matrix, are processed in parallel with one another (e.g., simultaneously).

The method 1200 operates by receiving an LDPC coded signal and performing pre-processed thereon (as shown in block 1205). Generally speaking, the operations within the block 1205 may be viewed as any of a variety of pre-processing operations including those performed within an AFE (analog front end) of a communication device that receives an LDPC coded signal from a communication channel. These pre-processing operations may include demodulation, symbol mapping, LLR (log likelihood ratio) calculation, initializing APP (or gamma(γ)) values using calculated LLR values, filtering (analog and/or digital), frequency conversion (up or down as needed), analog to digital conversion, and/or any other processing, etc. needed to be performed in accordance with pre-processing before beginning the iterative decoding processing of the LDPC coded signal.

The method 1200 continues by processing a first plurality of individual LDPC matrix rows located in a first sub-matrix, as shown in block 1210a. During a first time period, the method 1200 begins by processing a first plurality of individual LDPC matrix rows located in a second sub-matrix, as shown in block 1210b. These selected rows in each of the various sub-matrix rows of the LDPC matrix need not be the same selected rows (e.g., the selected rows in the first sub-matrix row maybe rows 1 through b, and the selected rows in the second sub-matrix row maybe rows x through x+b, or they may be selected in accordance with some other manner).

The method 1200 continues by processing a second plurality of individual LDPC matrix rows located in the first sub-matrix, as shown in block 1220a. During a second time period (i.e., second with respect to the first time period), the method 1200 begins by processing a second plurality of individual LDPC matrix rows located in the second sub-matrix, as shown in block 1220b.

This processing in accordance with the method 1200 continues until all individual rows within all of the sub-matrix rows (e.g., of the rows of all of the sub-matrices) of the LDPC matrix have been processed. At the completion of all individual rows of the LDPC matrix, the method 1200 is completed and the most recently updated APP (or gamma(γ)) values may be used (e.g., by hard limiting in some embodiments) to make an estimate of an information bit encoded within an LDPC coded signal (e.g., as shown in block 1230). In some embodiments, the step of block 1230 may be viewed as making an estimate of an LDPC codeword (i.e., including more than one information bit) encoded within the LDPC coded signal.

Permuted accelerated decoding of LDPC coded signal, as presented and described herein, is particularly effective for high throughput LDPC decoding. The congestion of this novel architecture remains low and does not scale with increased data throughput, unlike published turbo-style LDPC decoder architectures. Additional processing units can be added to this decoder architecture to increase throughput without increasing the routing complexity (or requiring additional multiplexers, BSs, etc.).

Moreover, the permuted accelerated decoder architecture can be applied across a wide variety of applications including communication systems that are IEEE 802.11n and IEEE 802.16e compliant. For example, the IEEE 802.16e standard has been designed with a parallel based LDPC decoder architecture in mind; as such, the permuted accelerated decoder architecture is well suited to run as an IEEE 802.16e LDPC decoder. Similarly this invention can be applied to communication devices and communication system operating in accordance with the IEEE 802.11n standard. Specifically, parallel based LDPC decoding is often chosen for high-throughput applications in which the convergence rate of the standard (BP) decoding approach is simply too slow to meet the throughput requirements of the application.

It is noted that the various modules (e.g., encoding modules, decoding modules, etc.) described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a first APP (a posteriori probability) daisy chain that is operative to output a first plurality of APP values;
a second APP daisy chain that is operative to output a second plurality of APP values;
a first plurality of check modules that is operative to employ first selected APP values, that are selected from the first plurality of APP values and the second plurality of APP values, to update a first plurality of check edge messages that corresponds to a first plurality of rows in a first sub-matrix row of a LDPC (Low Density Parity Check) matrix thereby generating a second plurality of check edge messages;
a second plurality of check modules that is operative to employ second selected APP values, that are selected from the first plurality of APP values and the second plurality of APP values, to update a third plurality of check edge messages that corresponds to a second plurality of rows in a second sub-matrix row of the LDPC matrix thereby generating a fourth plurality of check edge messages; and wherein:
the first plurality of APP values is updated using the second plurality of check edge messages thereby generating a third plurality of APP values;
the second plurality of APP values is updated using the fourth plurality of check edge messages thereby generating a fourth plurality of APP values; and
the apparatus employs the third plurality of APP values and the fourth plurality of APP values to make an estimate of an information bit encoded within an LDPC coded signal.

2. The apparatus of claim 1, further comprising:
a plurality of adders, connected to outputs of the first APP daisy chain and the second APP daisy chain, that is operative to process at least one additional selected APP values, that are selected from the first plurality of APP values and the second plurality of APP values, and at least one additional plurality of check edge messages, thereby generating a plurality of sums that is input to at least one of the first plurality of check modules and the second plurality of check modules.

3. The apparatus of claim 2, further comprising:
a plurality of check edge message daisy chains, connected to outputs of the first plurality of check modules and the second plurality of check modules, that is operative to:
receive the second plurality of check edge messages and the fourth plurality of check edge messages from the first plurality of check modules and the second plurality of check modules; and
output selected check edge messages, that are selected from the second plurality of check edge messages and the fourth plurality of check edge messages, to the plurality of adders.

4. The apparatus of claim 3, wherein:
the plurality of check edge message daisy chains is operative to modify alignment of the selected check edge messages before outputting the selected check edge messages to the plurality of adders.

5. The apparatus of claim 1, further comprising:
a first plurality of adders, connected to outputs of the first plurality of check modules and the second plurality of check modules, that is operative to process selected check edge messages, that are selected from the second plurality of check edge messages and the fourth plurality of check edge messages thereby generating a processed plurality of check edge messages;
a second plurality of adders, connected to outputs of the first plurality of adders and connected to inputs of the first APP daisy chain and a second APP daisy chain, that is operative to:
process the processed plurality of check edge messages thereby generating at least one additional processed plurality of check edge messages;
output the at least one additional processed plurality of check edge messages to at least one of the first APP daisy chain and the second APP daisy chain.

6. The apparatus of claim 1, wherein:
the first plurality of rows in the first sub-matrix row of the LDPC matrix includes a same number of rows as the second plurality of rows in the second sub-matrix row of the LDPC matrix.

7. The apparatus of claim 1, wherein:
the first plurality of check edge messages corresponds to the first plurality of rows in the first sub-matrix row of the LDPC matrix and also corresponds to a third plurality of rows in a third sub-matrix row of the LDPC matrix; and
the third plurality of check edge messages corresponds to the second plurality of rows in the second sub-matrix row of the LDPC matrix and also corresponds to a fourth plurality of rows in a fourth sub-matrix row of the LDPC matrix 8. The apparatus of claim 1, wherein:
the first plurality of rows in the first sub-matrix row of the LDPC matrix includes adjacent rows.

9. The apparatus of claim 1, wherein:
the first plurality of rows in the first sub-matrix row of the LDPC matrix includes non-adjacent rows.

10. The apparatus of claim 1, wherein:
the first plurality of rows in the first sub-matrix row of the LDPC matrix is located a first row offset from a top row within the first sub-matrix row of the LDPC matrix; and
the second plurality of rows in the second sub-matrix row of the LDPC matrix is located a second row offset from a top row within the second sub-matrix row of the LDPC matrix.

11. The apparatus of claim 1, wherein:
the apparatus is a communication device;
the communication device is a transceiver or a receiver; and
the communication device is implemented within at least one of a satellite communication system, a wireless communication system, a wired communication system, and a fiber-optic communication system.

12. An apparatus, comprising:
an APP (a posteriori probability) daisy chain that is operative to output a first plurality of APP values;
a first plurality of check modules, connected to the APP daisy chain at a first plurality of taps of the APP daisy chain, that is operative to employ first selected APP values, that are selected from the first plurality of APP values, to update a first plurality of check edge messages that corresponds to a first plurality of rows in a first sub-matrix row of a LDPC (Low Density Parity Check) matrix thereby generating a second plurality of check edge messages;
a second plurality of check modules, connected to the APP daisy chain at a second plurality of taps of the APP daisy chain, that is operative to employ second selected APP values, that are selected from the first plurality of APP values, to update a third plurality of check edge messages that corresponds to a second plurality of rows in a second sub-matrix row of the LDPC matrix thereby generating a fourth plurality of check edge messages; and wherein:
at least one APP value of the plurality of APP values is included within the first selected APP values and the second selected APP values;
the first plurality of APP values is updated using the second plurality of check edge messages thereby generating a second plurality of APP values; and
the apparatus employs the second plurality of APP values to make an estimate of an information bit encoded within an LDPC coded signal.

13. The apparatus of claim 12, wherein:
the APP daisy chain includes a plurality of registers such that each one of the plurality of registers is connected to an output of a respective first other register of the plurality of registers and is connected to an input of a respective second other register of the plurality of registers; and
the first plurality of taps and the second plurality of taps correspond to first selected connections and second selected connections, respectively, between the plurality of registers within the APP daisy chain.

14. The apparatus of claim 12, wherein:
the first plurality of rows in the first sub-matrix row of the LDPC matrix includes a same number of rows as the second plurality of rows in the second sub-matrix row of the LDPC matrix.

15. The apparatus of claim 12, wherein:
the first plurality of check edge messages corresponds to the first plurality of rows in the first sub-matrix row of the LDPC matrix and also corresponds to a third plurality of rows in a third sub-matrix row of the LDPC matrix; and
the third plurality of check edge messages corresponds to the second plurality of rows in the second sub-matrix row of the LDPC matrix and also corresponds to a fourth plurality of rows in a fourth sub-matrix row of the LDPC matrix.

16. The apparatus of claim 12, wherein:
the apparatus is a communication device;
the communication device is a transceiver or a receiver; and
the communication device is implemented within at least one of a satellite communication system, a wireless communication system, a wired communication system, and a fiber-optic communication system.

17. A method, comprising:
from a first APP (a posteriori probability) daisy chain, outputting a first plurality of APP values;
from a second APP daisy chain, outputting a second plurality of APP values;
employing a first plurality of check modules to employ first selected APP values, that are selected from the first plurality of APP values and the second plurality of APP values, to update a first plurality of check edge messages that corresponds to a first plurality of rows in a first sub-matrix row of a LDPC (Low Density Parity Check) matrix thereby generating a second plurality of check edge messages;
employing a second plurality of check modules to employ second selected APP values, that are selected from the first plurality of APP values and the second plurality of APP values, to update a third plurality of check edge messages that corresponds to a second plurality of rows in a second sub-matrix row of the LDPC matrix thereby generating a fourth plurality of check edge messages;
updating the first plurality of APP values using the second plurality of check edge messages thereby generating a third plurality of APP values;
updating the second plurality of APP values using the fourth plurality of check edge messages thereby generating a fourth plurality of APP values; and
employing the third plurality of APP values and the fourth plurality of APP values to make an estimate of an information bit encoded within an LDPC coded signal.

18. The method of claim 17, further comprising:
employing a plurality of check edge message daisy chains to modify alignment of selected check edge messages generated during a first decoding iteration, that are selected from the second plurality of check edge messages and the fourth plurality of check edge messages, thereby generating at least one additional selected check edge messages for use during a second decoding iteration.

19. The method of claim 17, wherein:

the first plurality of check edge messages corresponds to the first plurality of rows in the first sub-matrix row of the LDPC matrix and also corresponds to a third plurality of rows in a third sub-matrix row of the LDPC matrix; and the third plurality of check edge messages corresponds to the second plurality of rows in the second sub-matrix row of the LDPC matrix and also corresponds to a fourth plurality of rows in a fourth sub-matrix row of the LDPC matrix.

20. The method of claim 17, wherein:

the method is performed within a communication device;

the communication device is a transceiver or a receiver; and the communication device is implemented within at least one of a satellite communication system, a wireless communication system, a wired communication system, and a fiber-optic communication system.

\* \* \* \* \*

UNITED STATES PATENT AND TRADEMARK OFFICE
CERTIFICATE OF CORRECTION

PATENT NO. : 8,341,489 B2  
APPLICATION NO. : 12/512820  
DATED : December 25, 2012  
INVENTOR(S) : Alvin Lai Lin et al.

Page 1 of 1

It is certified that error appears in the above-identified patent and that said Letters Patent is hereby corrected as shown below:

In the Claims
Col. 19, line 11, in claim 7: after "matrix" insert --.--
Col. 21, line 2, in claim 18: replace "messages" with --message--

Signed and Sealed this
Twenty-fourth Day of December, 2013

Margaret A. Focarino
*Commissioner for Patents of the United States Patent and Trademark Office*